United States Patent [19]

Tove et al.

[11] Patent Number: 4,554,569
[45] Date of Patent: Nov. 19, 1985

[54] INTEGRATED ELECTRON CIRCUITS HAVING SCHOTTKY FIELD EFFECT TRANSISTORS OF P- AND N-TYPE

[76] Inventors: Per-Arne Tove, Malma Ringväg 36, S-752 46 Uppsala; Kjell Bohlin, Fänkålsgatan 23, S-754 47 Uppsala; Lars Stolt, Flogstavägen 59E, S-752 63 Uppsala; Herman Norde, Studentvägen 22, S-752 34 Uppsala, all of Sweden

[21] Appl. No.: 441,530
[22] PCT Filed: Mar. 29, 1982
[86] PCT No.: PCT/SE82/00093
   § 371 Date: Nov. 3, 1982
   § 102(e) Date: Nov. 3, 1982
[87] PCT Pub. No.: WO82/03498
   PCT Pub. Date: Oct. 14, 1982

[30] Foreign Application Priority Data
Mar. 27, 1981 [SE] Sweden ................... 8101994

[51] Int. Cl.$^4$ ............... H01L 29/48; H01L 29/80; H01L 27/02; H01L 29/56
[52] U.S. Cl. ............... 357/15; 357/22; 357/41; 357/42
[58] Field of Search ............ 357/15 A, 22 S, 42, 357/65, 41, 15 M, 15 R, 22 R

[56] References Cited

U.S. PATENT DOCUMENTS

| | | | |
|---|---|---|---|
| 3,767,984 | 10/1973 | Shinoda et al. | 357/16 |
| 3,997,908 | 12/1976 | Schloetterer et al. | 357/15 |
| 4,141,020 | 2/1979 | Howard et al. | 357/15 |
| 4,160,984 | 7/1979 | Ladd, Jr. et al. | 357/15 |
| 4,173,764 | 11/1979 | de Cremoux | 357/15 |
| 4,236,166 | 11/1982 | Cho et al. | 357/15 |
| 4,300,152 | 11/1981 | Lepselter | 357/42 |
| 4,325,181 | 4/1982 | Yoder | 357/15 |
| 4,394,673 | 7/1983 | Thompson et al. | 357/15 |

FOREIGN PATENT DOCUMENTS

| | | | |
|---|---|---|---|
| 0005185 | 11/1979 | European Pat. Off. | 357/15 A |
| 0017021 | 10/1980 | European Pat. Off. | 357/15 A |
| 2607898 | 9/1976 | Fed. Rep. of Germany | 357/15 A |

OTHER PUBLICATIONS

W. Jutzi, "MESFET with Threshold Source-Drain Voltage", *IBM Technical Disclosure Bulletin*, vol. 11, (1969), p. 1184.
S. M. Sze, *Physics of Semiconductor Devices*, Wiley-Interscience, pp. 366, 370.
D. J. DiMaria et al, "High Efficiency MESFET", *IBM Technical Disclosure Bulletin*, vol. 21, (1978), p. 2114.
R. A. Scranton et al, "Highly Electronegative Metallic Contacts to Semiconductors Using Polymeric Sulfur Nitride", *Applied Physics Letters*, vol. 29, (1976), pp. 47-48.

*Primary Examiner*—A. James
*Assistant Examiner*—J. Carroll
*Attorney, Agent, or Firm*—Witherspoon & Hargest

[57] ABSTRACT

Electronic circuit containing at least one Schottky field effect transistor with contact elements having different Schottky barrier heights.

18 Claims, 9 Drawing Figures

FIG. 4a
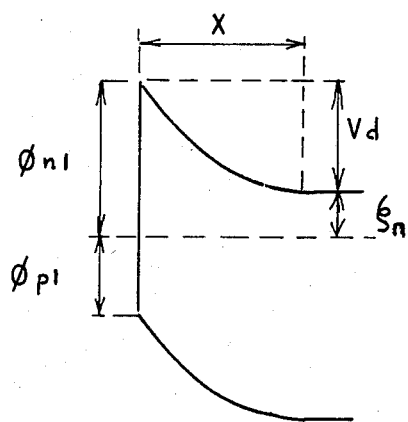
FIG. 4b
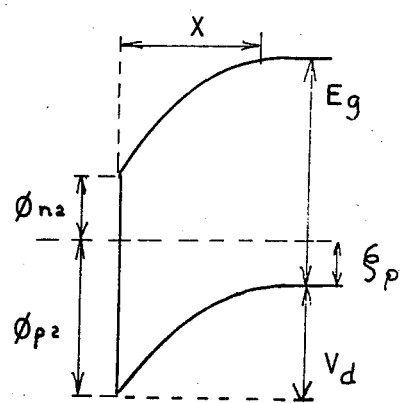
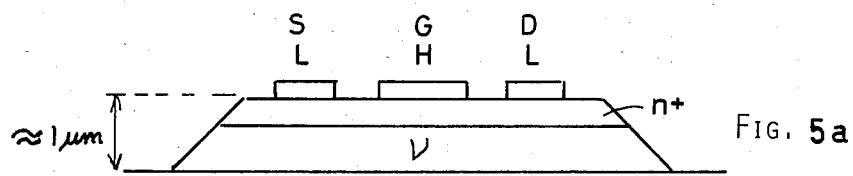
FIG. 5a
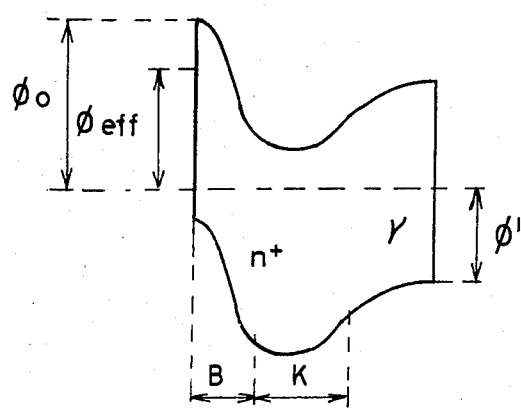
FIG. 5b

INTEGRATED ELECTRON CIRCUITS HAVING SCHOTTKY FIELD EFFECT TRANSISTORS OF P- AND N-TYPE

Figure 1A:
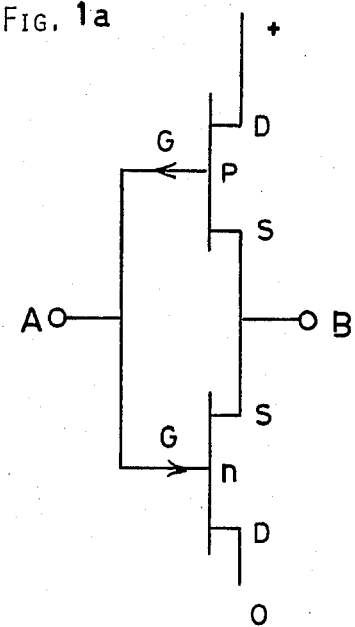

FIGS. 1a and b show two versions of how the complementary field-effect transistors which are discussed below can be used to form a digital circuit, in this case an inverter. The circuit principle is known and is usually realized with transistors of MOS-type (metal-oxide-semiconductor). When A is high (close to the + voltage) then B is low (close to 0 or the −voltage), and conversely.

It is also known that the gate electrodes G, instead of consisting of a metal contact (or of a nearly metallically conducting polysilicon contact) on oxide, can consist of metal contacts directly on the semiconductor surface. The semiconductor can be silicon or GaAs, InP, $InP_{1-x}As_x$, $In_yGa_{1-y}As$, etc. (x and y<1).

The new concept is to use, in a suitable way, two different metals (or nearly metallically conducting materials), with different Schottky barrier heights (defined here as to n-type material), one high, the other low, as contacts to the semiconductor. It is known that a low barrier gives a low-resistive contact to n-type semiconductor (in contrast to a high barrier contact which conducts very little), and that a high barrier gives a low-resistive contact to p-type semiconductor (in contrast to a low barrier contact which conducts very little.

The source- and drain-electrodes S and D in the diagrams of FIG. 1 shall in principle be low-resistive contacts to the semiconductor. For an n-channel transistor, the S- and D-connections are layers of the material with low Schottky barrier, below called the "low-metal". The layers are made by evaporation, sputtering, etc. and are patterned by suitable methods, e.g. using photolithographic methods. For a p-channel transistor S and D are made of the "high-metal". The gate electrodes (one or more) for the n-channel transistor are made of the "high-metal", for the p-channel transistor of the "low-metal". Different methods of constructing the transistors will be described below.

1. See FIG. 2.

The layer A with typical thickness 0.1–0.5 μm consists of a suitably doped (often with ion-implantation) n-type semiconductor. The layer B can be a layer with considerably lower conductivity (for instance be the remaining part of an epitaxial layer A+B on the insulator saphire C; alternatively B can be a differently doped, for instance high-resistive p-type, part of the semiconductor). That part of the n-layer which is below G can in the extreme states be either depleted of free carriers (i.e. form a depletion layer) and then impede current flow between S and D, or have many free carriers; the transistor then conducts because of easy current transport between S and D. Because G is made from the "high-metal", a depletion layer with thickness $X_o$ is formed in the n-layer below, if G is connected (directly or via a resistor) to S. The current between S and D then becomes low. When a positive bias $V_{forw.}$ is applied to G relative to S, the depletion width decreases, and becomes smaller than the thickness of the A-layer, hence a conducting channel is formed between S and D. By choosing a "high-metal" with very high barrier, e.g. iridium with a barrier of approximately 0.9 electron-volts, $X_o$ can be large at the same time as the forward current $j_{forw.}$ to G $$j_{forw.} \approx A^{**}T^2 e^{\frac{-q\phi}{kT}} \cdot e^{\frac{qV_{forw.}}{kT}}$$

becomes small, even if $V_{forw.}$ is a few tenths of a volt. (For a barrier height $\phi$ of approximately 0.9 eV the current becomes of the order of $10^{-10}$–$10^{-9}$ A for a transistor with the channel-length l of ≈2 μm and a channel width w of 300 μm, for $V_{forw.} \approx 0.3$ V). The positive supply voltage + in FIG. 1 therefore can be several tenths of a volt, without the input A loading the output B of a preceding similar cell as that of FIG. 1, too much.

Figure 2:
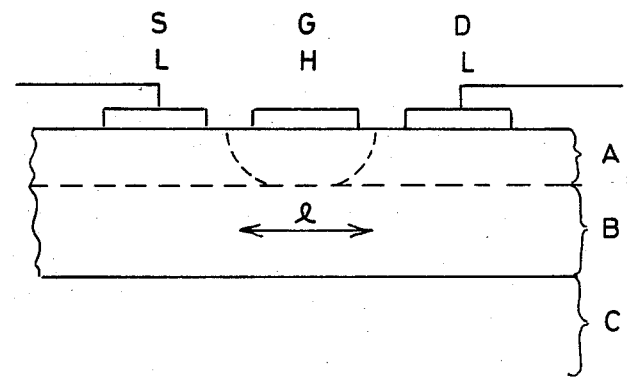

The p-transistor is constructed in a similar way to that shown in FIG. 2, but using a p-type layer A and with the L- and H-metals interchanged.

Figure 3:
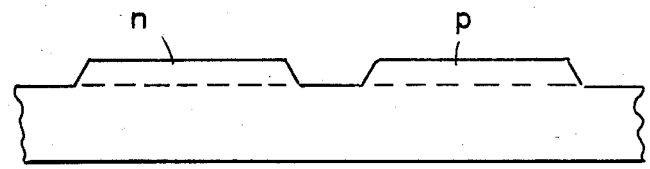
Figure 6:
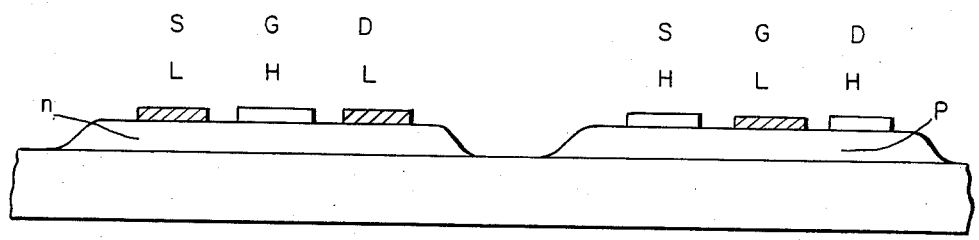

To form the CMES-cell in FIG. 1a, the n- and p-channel transistors are formed on different "islands" on the semiconductor whereby the islands are isolated from each other with any of several commonly used isolation methods in semiconductor technology. If silicon on saphire is used, the simple method of etching ditches down to the saphire can be used, as seen in FIG. 3 and depicted in greater detail in FIG. 6.

The relation between the resistivity $\rho$ in the n-channel in FIG. 2, and the width X is approximately given by $$X \approx \tfrac{1}{2}\sqrt{\rho V_d} \quad (\rho \text{ in } \Omega\text{cm}, X \text{ in } \mu\text{m}),$$

Here $V_d = \phi_{n1} - \zeta_n$, where $\phi_{n1}$ is the barrier height of the contact and $\zeta_n = \zeta(\rho)$ is the distance between the conduction band and the Fermi level, see FIG. 4. The corresponding relations are obtained for the p-transistor where the barrier height is $\phi_{p2}$.

The CMES-cell in FIG. 1a uses "enhancement transistors"; to have the transistor conduct one must apply a voltage $V_{GS} \neq 0$ of suitable polarity between G and S.

The n-layer in FIG. 2 is so highly doped, for instance to $10^{16}$–$10^{17}$ cm$^{-3}$, that it has a conductivity of, say $10^{-4} \Omega^{-1}$ per square.

Figure 1B:
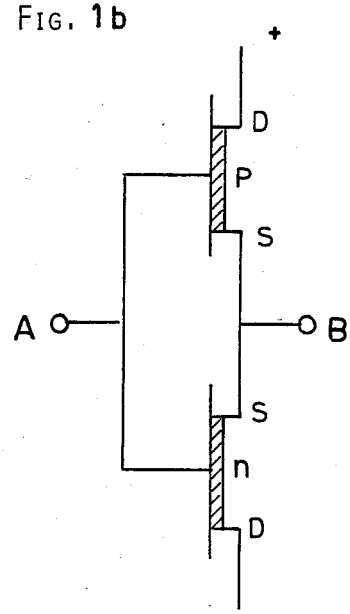

For the CMES-cell in FIG. 1b the transistors are of depletion type. That is, in order to shut off the transistor one has to apply a voltage $V_{GS} \neq 0$ on G. One version of this type of transistor will be described below, with reference to FIG. 5.

2. As an example is shown an n-channel depletion type transistor on a silicon-on-saphire-island. $\nu$ is a low-doped n-layer and n+ is a highly doped n-layer. The potential profile under G for $V_{GS}=0$ (see FIG. 5b) shows that the depletion width B is small, and part of the n+-doped layer forms a channel K with good conductivity. The doping is adjusted, e.g. using ion implantation, to a suitable depth profile so that K becomes sufficiently conducting, say $10^{-4}\Omega^{-1}$ per square, but so the effective barrier $\phi_{eff}$ for current transport, because of tunneling effect, does not become appreciably lower than the high barrier $\phi_o$. When a negative voltage is applied to G, relative to S, then B is increased (K decreases) and the channel conductance decreases. $\phi_{eff}$ should not be so low that considerable current is flowing to G (see above). Nor should $\phi'$ be so low that a large hole current can flow from the substrate.

The p-channel depletion transistor can be constructed on the same $\nu$-wafer, but using p+-doping, and the low- and high metals are interchanged compared with above.

The difference in function between the L- and H-contacts becomes large because of the exponential dependence on $\phi$, see for instance the expression for $j_{forw}$ above. For L and H one may choose materials with the lowest and highest known barriers. For L a possible choice is one of the rare earth metals Tb, Er, Yb, Y, which give approximately 0.3–0.4 eV barrier height. Alternatively other contact materials, for instance Mn, Hf or Al, silicides, highly doped semiconductor films or conducting plastics, etc., can be used.

For H one may use noble metals with high barrier, for instance Ir (0.9 eV), Pt, Os, etc. Other contact materials, e.g. Mo, silicides, highly doped semiconductor layers or conducting plastics etc. can also be used.

For passivation of the fabricated circuit one may for instance use CVD-oxide. When the contact films are deposited one can start from a smiconductor surface with a thin layer of silicon-oxide on top, in which holes for the contacts are made. The contact pattern that connects the different transistors with each other and with external connections can be the L- and H-materials themselves, or another material, e.g. aluminium, or consist of a sandwich of both. To avoid reactions in solid phase between the films one may use intermediate layers which can stop diffusion, e.g. a layer of titanium. The gap between the L- and H-metals, in CMES-cells usually of the magnitude $\mu m$, may be given a chemical treatment or irradiation dose so that a suitable band-bending is obtained at the surface, whereby the gap can be made small.

The principles above can also be used to fabricate larger units that can be used for power control.

The electrodes marked D and S in FIG. 1 can also be interchanged. S and D are identical in the schematics drawn here but a certain difference in the electrical characteristics can then be obtained. Electrical connections to the substrate, if any, are normally connected to S.

When fabricating the transistors described above on compound semiconductors like GaAs etc., which can give faster circuits than silicon circuits, the technology offers, beside simplicity and possibility to achieve extremely small dimensions, also the advantage that compounds can be used which can be doped only with difficulty and where formation of pn-junctions is difficult. Suitable H-materials for GaAs can be: Au, Bi, Sb, Pt, Ag, $(SN)_x$-polymers etc; for L-materials: Ca, Mg, W etc.

From the description above it is clear that the described circuit is particularly suited for fabrication of integrated circuits with high packing density, because the transistors can be fabricated with fewer process-steps than what has been possible before. One factor here is that the same material (L and H) performs complementary functions in the two transistors of a complementary circuit, thereby permitting easy and highly conducting interconnection patterns. The complementary switch circuit plays an increasing role in digital circuits, in memories, registers, counters etc. A simple fabrication process reduces the number of faults and hence gives increased fabrication yield.

The circuit described above can, besides in digital circuits be used also in linear (analogue) circuits, microwave applications, power applications etc.

We claim:

1. Integrated electronic circuit comprising Schottky field effect transistors of both p- and n-type, the contact elements to the transistors comprising two conductor types, the first of which has a low Schottky barrier to n-type material and makes contact with source and drain of n-transistors and gate of p-transistors, and the second of which has a high Schottky barrier to n-type material and makes contact with source and drain of p-transistors and gate of n-transistors.

2. The circuit of claim 1 wherein said two conductor types comprise metals or materials with metallic conductivity.

3. The circuit of claim 1 or 2 wherein the second conductor comprises material selected from the group consisting of Ir, Pt, Os, Mo, silicides, conducting plastics, Au, Bi, Sb, Ag or $(SN)_x$-polymers.

4. The circuit of claim 1 wherein the first conductor comprises material selected from the group consisting of Tb, Er, Yb, Y, Mn, Hf, Al, silicides, conducting plastics, Ca, Mg or W.

5. The circuit of claim 2 wherein the first conductor comprises material selected from the group consisting of Tb, Er, Yb, Y, Mn, Hf, Al, silicides, conducting plastics, Ca, Mg or W.

6. The circuit of claim 3 wherein the first conductor comprises material selected from the group consisting of Tb, Er, Yb, Y, Mn, Hf, Al, silicides, conducting plastics, Ca, Mg or W.

7. The circuit of claim 1 wherein the contact pattern connecting the different transistors with each other is of the same material as one of the contact elements.

8. The circuit of claim 2 wherein the contact pattern connecting the different transistors with each other is of the same material as one of the contact elements.

9. The circuit of claim 3 wherein the contact pattern connecting the diffeent transistors with each other is of the same material as one of the contact elements.

10. The circuit of claim 4 wherein the contact pattern connecting the different transistors with each other is of the same material as one of the contact elements.

11. The circuit of claim 1 wherein the contact pattern connecting the different transistors with each other is of the same two materials as the contact elements.

12. The circuit of claim 2 wherein the contact pattern connecting the different transistors with each other is of the same two materials as the contact elements.

13. The circuit of claim 3 wherein the contact pattern connecting the different transistors with each other is of the same two materials as the contact elements.

14. The circuit of claim 4 wherein the contact pattern connecting the different transistors with each other is of the same two materials as the contact elements.

15. The circuit of claim 1 wherein the contact pattern connecting the different transistors with each other is of material different from the materials of the contact elements.

16. The circuit of claim 2 wherein the contact pattern connecting the different transistors with each other is of material different from the materials of the contact elements.

17. The circuit of claim 3 wherein the contact pattern connecting the different transistors with each other is of material different from the materials of the contact elements.

18. The circuit of claim 4 wherein the contact pattern connecting the different transistors with each other is of material different from the materials of the contact elements.

* * * * *